United States Patent
Lee et al.

(10) Patent No.: US 12,228,833 B2
(45) Date of Patent: Feb. 18, 2025

(54) LIQUID CRYSTAL DISPLAY DEVICE

(71) Applicant: Samsung Display Co., Ltd., Yongin-si (KR)

(72) Inventors: Kye Uk Lee, Seoul (KR); Ja Yong Koo, Anyang-si (KR); Kee Bum Park, Cheonan-si (KR); Jae Yong Shin, Anyang-si (KR); Seong Young Lee, Hwaseong-si (KR); Seul Bee Lee, Suwon-si (KR); Woong Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 175 days.

(21) Appl. No.: 17/215,666

(22) Filed: Mar. 29, 2021

(65) Prior Publication Data
US 2021/0215960 A1    Jul. 15, 2021

Related U.S. Application Data

(63) Continuation of application No. 15/871,428, filed on Jan. 15, 2018, now Pat. No. 10,962,852.

(30) Foreign Application Priority Data

Jul. 13, 2017    (KR) .................. 10-2017-0089052

(51) Int. Cl.
   G02F 1/1362    (2006.01)
   G02F 1/1368    (2006.01)
   (Continued)

(52) U.S. Cl.
   CPC ........ *G02F 1/1368* (2013.01); *G02F 1/13624* (2013.01); *G02F 1/136286* (2013.01);
   (Continued)

(58) Field of Classification Search
   CPC ......... G02F 1/134345; G02F 1/134354; G02F 1/13624; G02F 1/136245; H01L 27/124; H01L 27/1255
   See application file for complete search history.

(56) References Cited

U.S. PATENT DOCUMENTS 8,804,083 B2    8/2014  Park et al.
10,068,539 B2   9/2018  Kim et al.
(Continued)

FOREIGN PATENT DOCUMENTS

CN    101958318      1/2011
KR    1020140021105 A  2/2014
(Continued)

OTHER PUBLICATIONS

Korean Office Action—Korean Application No. 10-2017-0089052 dated Sep. 24, 2021.
(Continued)

*Primary Examiner* — Bryan R Junge
(74) *Attorney, Agent, or Firm* — CANTOR COLBURN LLP

(57) ABSTRACT

A liquid crystal display device includes a substrate, first through third thin-film transistors ("TFTs") disposed on the substrate, and first and second sub-pixel electrodes disposed above the first through third TFTs. The second and third TFTs share a single output terminal as their output terminals, the first sub-pixel electrode is electrically connected to an output terminal of the first TFT, and the second sub-pixel electrode is electrically connected to the single output terminal of the second and third TFTs.

20 Claims, 11 Drawing Sheets

(51) Int. Cl.
*H01L 21/027* (2006.01)
*H01L 27/12* (2006.01)
*H01L 29/417* (2006.01)
*G02F 1/1337* (2006.01)
*G02F 1/1343* (2006.01)

(52) U.S. Cl.
CPC ........ *H01L 21/0273* (2013.01); *H01L 27/124* (2013.01); *H01L 29/41733* (2013.01); *G02F 1/1337* (2013.01); *G02F 1/133742* (2021.01); *G02F 1/134345* (2021.01); *G02F 1/136295* (2021.01); *G02F 2201/123* (2013.01); *H01L 27/1262* (2013.01)

(56) References Cited

U.S. PATENT DOCUMENTS

| | | | |
|---|---|---|---|
| 10,527,901 B2 | 1/2020 | No et al. | |
| 10,852,612 B2 | 12/2020 | No et al. | |
| 2007/0120797 A1* | 5/2007 | Lin | G09G 3/3648 345/92 |
| 2008/0122772 A1* | 5/2008 | Takeuchi | G02F 1/134336 345/89 |
| 2008/0303970 A1* | 12/2008 | Wang | G02F 1/13624 349/48 |
| 2009/0231505 A1 | 9/2009 | Wang et al. | |
| 2011/0013105 A1 | 1/2011 | Jung et al. | |
| 2011/0279734 A1 | 11/2011 | Tsubata | |
| 2012/0105785 A1 | 5/2012 | Kim et al. | |
| 2013/0208206 A1 | 8/2013 | Park et al. | |
| 2015/0316821 A1 | 11/2015 | Lee et al. | |
| 2015/0323845 A1 | 11/2015 | Chang et al. | |
| 2016/0118005 A1* | 4/2016 | Kim | G02F 1/13 345/92 |
| 2016/0320672 A1 | 11/2016 | Hong et al. | |
| 2017/0010508 A1 | 1/2017 | Jung | |
| 2017/0108723 A1 | 4/2017 | No et al. | |

FOREIGN PATENT DOCUMENTS

| | | |
|---|---|---|
| KR | 1020150017805 A | 2/2015 |
| KR | 1020160049155 | 5/2016 |
| KR | 1020170044226 | 4/2017 |

OTHER PUBLICATIONS

Chinese Office Action—Chinese Application No. 201810446468.1 dated Jul. 4, 2022.

* cited by examiner

LIQUID CRYSTAL DISPLAY DEVICE

This application is a continuation of U.S. patent application Ser. No. 15/871,428, filed on Jan. 15, 20218, which claims priority to Korean Patent Application No. 10-2017-0089052, filed on Jul. 13, 2017, and all the benefits accruing therefrom under 35 U.S.C. § 119, the content of which in its entirety is herein incorporated by reference.

BACKGROUND

1. Field

Exemplary embodiments of the invention relate to a liquid crystal display ("LCD") device.

2. Description of the Related Art

An LCD device, which is one of the most commonly used display devices, includes at least one substrate where field-generating electrodes such as pixel electrodes and a common electrode are disposed and a liquid crystal layer which is disposed between the pixel electrodes and the common electrode. The LCD device generates an electric field in the liquid crystal layer by applying voltages to the field-generating electrodes so as to determine the orientation of liquid crystal molecules in the liquid crystal layer, and displays an image by controlling the polarization of light incident thereupon using the electric field.

A vertical alignment ("VA")-mode LCD device has been developed in which the long axes of liquid crystal molecules are aligned substantially perpendicularly to upper and lower substrates in the absence of an electric field.

Meanwhile, an exposure apparatus used to form layers of the TFTs applies ultraviolet ("UV") light to a substrate while moving in a particular direction.

SUMMARY

The VA-mode LCD device may have a different brightness when viewed from the front than when viewed from a side. Thus, it is necessary to minimize the difference between the brightness of the VA-mode LCD device as viewed from the front and the brightness of the VA-mode LCD device as viewed from a side. Accordingly, a structure has been suggested in which two sub-pixel electrodes are provided in each pixel and are supplied with different voltages. In order to supply different voltages to the two sub-pixel electrodes, a plurality of thin-film transistors ("TFTs") are used, and the lower one of the voltages applied to the two sub-pixel electrodes is determined by the channel length and width of each of the TFTs.

However, since the TFTs differ in shape from one pixel to another pixel, deviations in the channel length of the TFTs are affected by whether the moving direction of the exposure apparatus is the same as the direction in which the channels of the TFTs are formed. When there are large deviations in the channel length of the TFTs, the lower one of the voltages applied to the two sub-pixel electrodes may differ from one pixel to another pixel, and as a result, smudges may become visible.

Exemplary embodiments of the invention provide a liquid crystal display ("LCD") device having deviations in channel lengths of thin-film transistors ("TFTs") effectively minimized.

However, exemplary embodiments of the invention are not restricted to those set forth herein. The above and other exemplary embodiments of the invention will become more apparent to one of ordinary skill in the art to which the invention pertains by referencing the detailed description of the invention given below.

According to an exemplary embodiment of the invention, an LCD device includes a substrate, first through third TFTs disposed on the substrate, and first and second sub-pixel electrodes disposed above the first through third TFTs, where the second and third TFTs share a single output terminal as their output terminals, the first sub-pixel electrode is electrically connected to an output terminal of the first TFT, and the second sub-pixel electrode is electrically connected to the single output terminal of the second and third TFTs.

According to another exemplary embodiment of the invention, a liquid crystal display device includes a substrate, a data line disposed on the substrate, a gate line and a sustain electrode which intersect the data line, and first through third TFTs electrically connected to the data line, the gate line, and the sustain electrode, and first and second sub-pixel electrodes disposed above the first through third TFTs. The first TFT includes a first source electrode electrically connected to the data line, a first drain electrode electrically connected to the first sub-pixel electrode, and a first gate electrode electrically connected to the gate line. The second TFT includes a second source electrode electrically connected to the data line, a second drain electrode electrically connected to the second sub-pixel electrode, and a second gate electrode electrically connected to the gate line. The third TFT includes a third source electrode electrically connected to the sustain electrode, a second drain electrode electrically connected to the second sub-pixel electrode, and a third gate electrode electrically connected to the gate line.

According to the aforementioned and other exemplary embodiments of the invention, an LCD device having deviations in channel lengths of TFTs effectively minimized can be provided.

Other features and exemplary embodiments may be apparent from the following detailed description, the drawings, and the claims.

BRIEF DESCRIPTION OF THE DRAWINGS

The above and other exemplary embodiments and features of the invention will become more apparent by describing in detail exemplary embodiments thereof with reference to the attached drawings, in which.

DETAILED DESCRIPTION

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Hereinafter, preferred embodiments of the invention will be described in detail with reference to the accompanying drawings.

Figure 1:
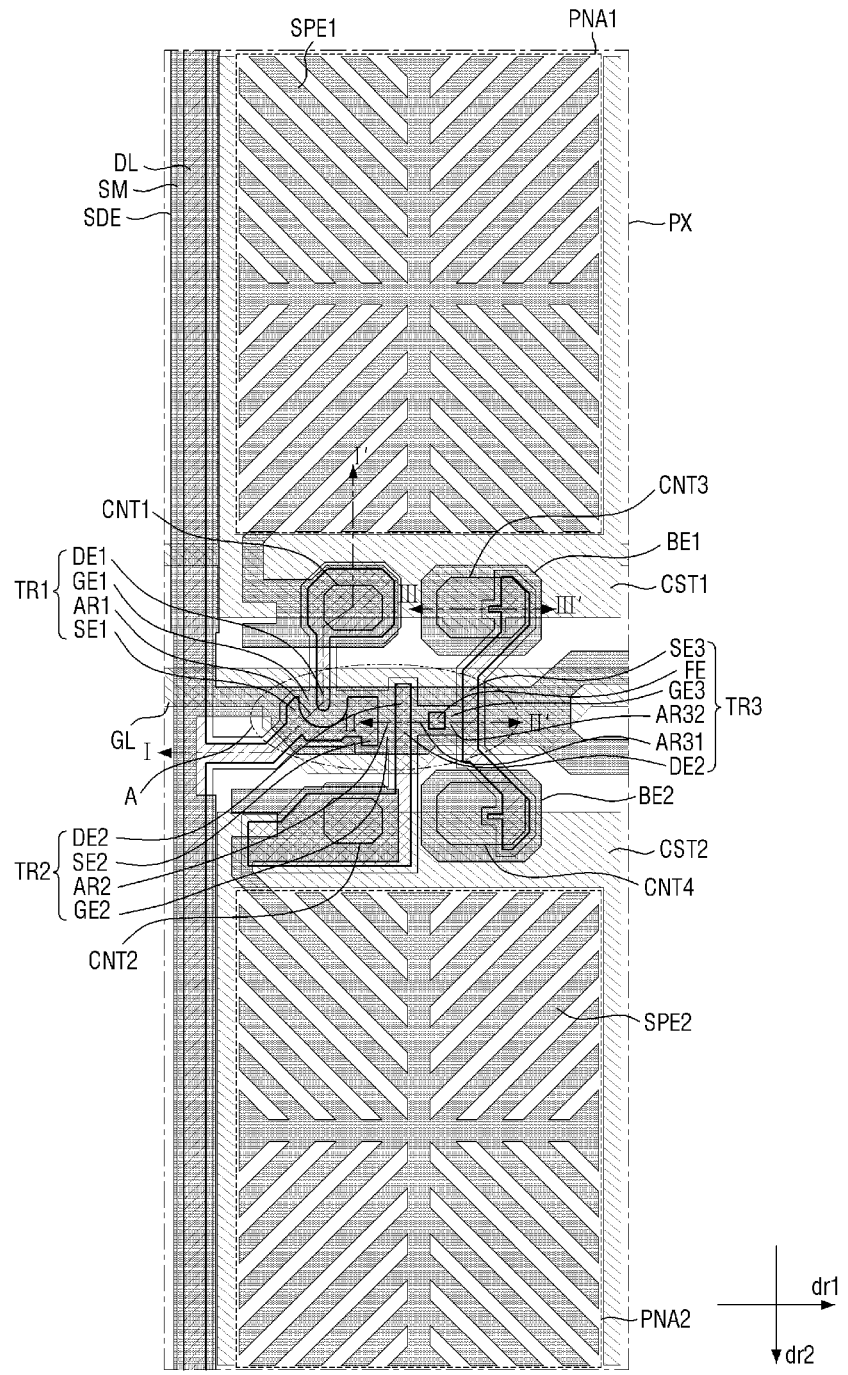
FIG. 1 is a plan view of an exemplary embodiment of a pixel of a liquid crystal display ("LCD") device according to the invention.
Figure 2:
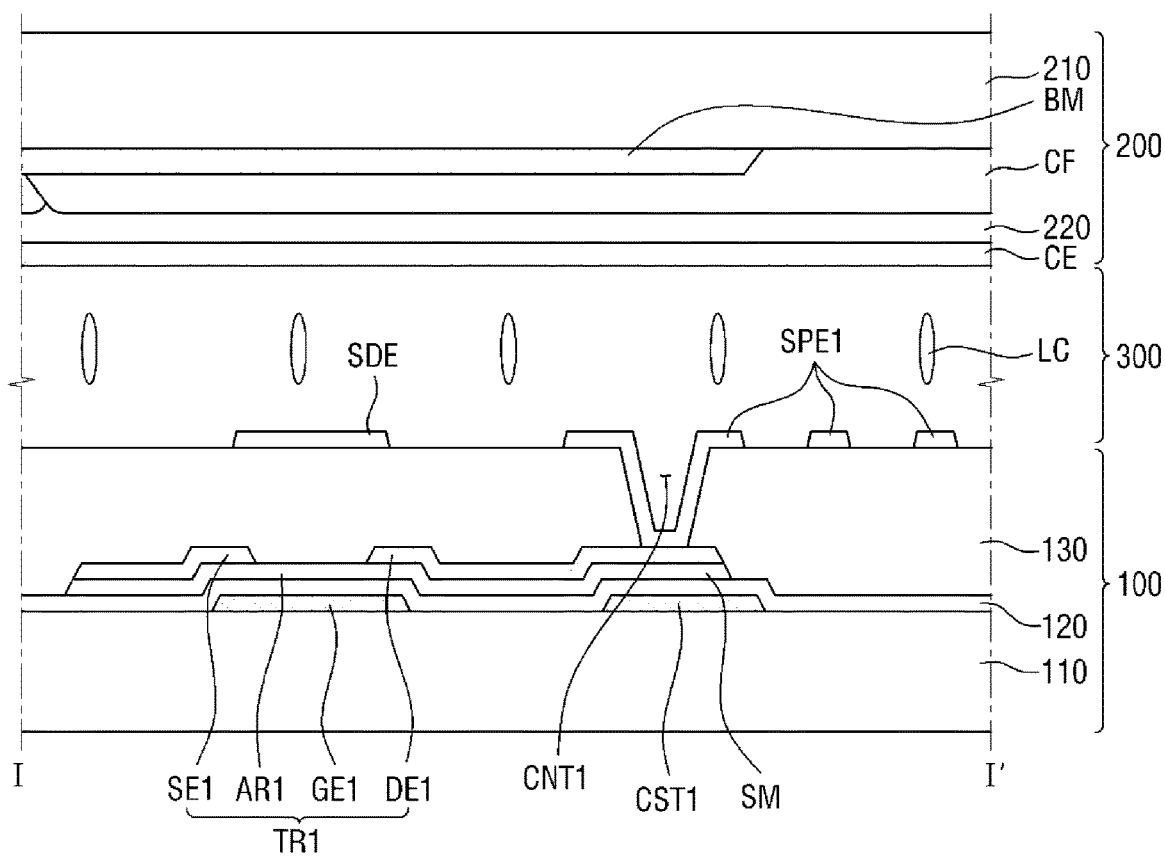
FIG. 2 is a cross-sectional view taken along line I-I' of FIG. 1.
Figure 3:
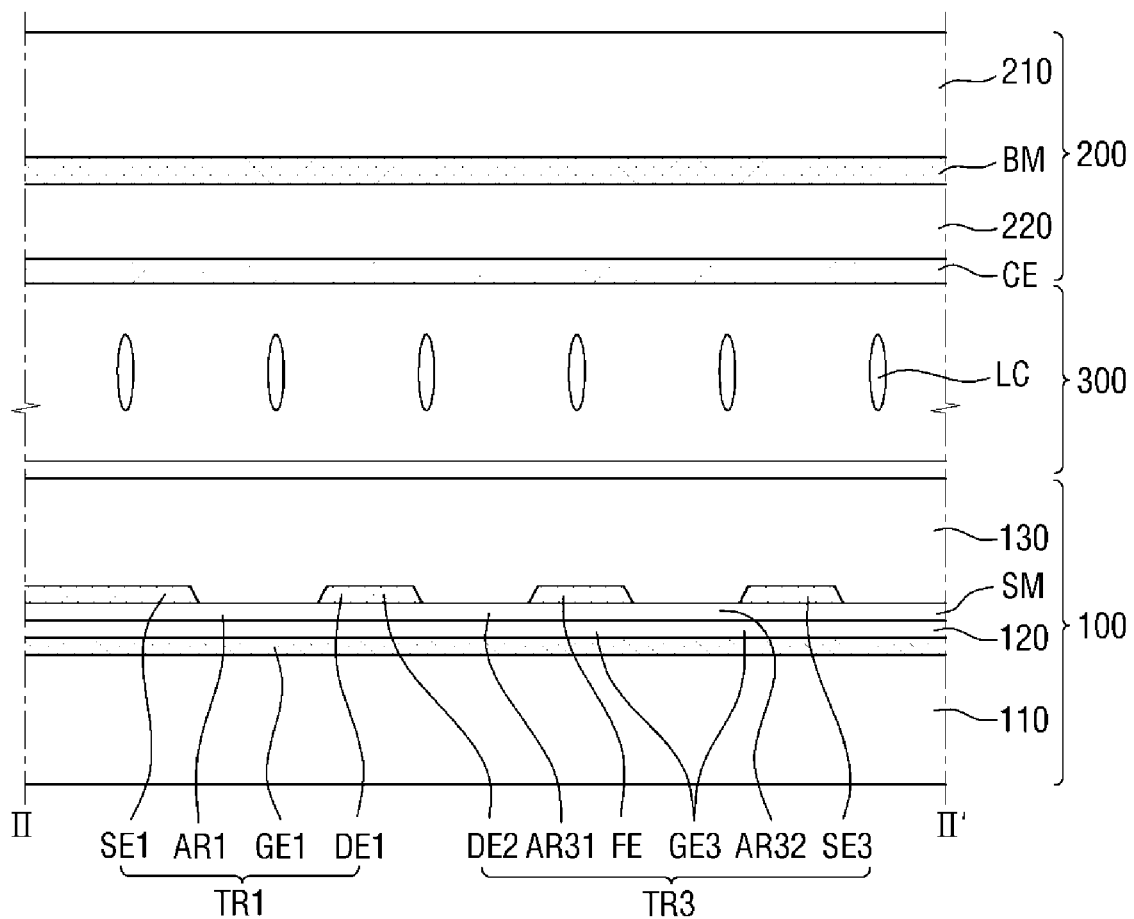
FIG. 3 is a cross-sectional view taken along line II-II' of FIG. 1.
Figure 4:
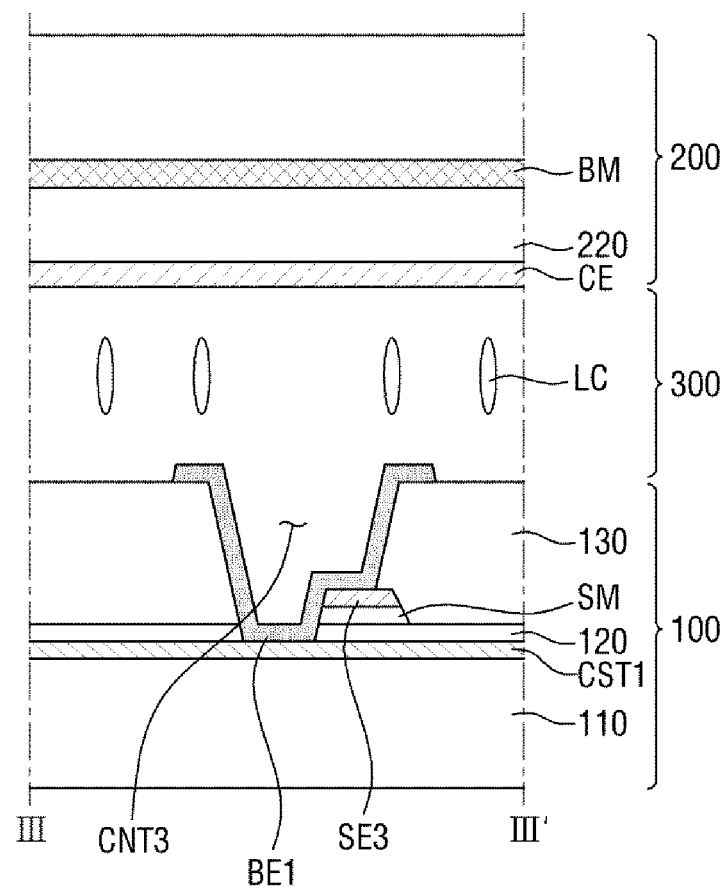
FIG. 4 is a cross-sectional view taken along line III-III' of FIG. 1.
Figure 5:
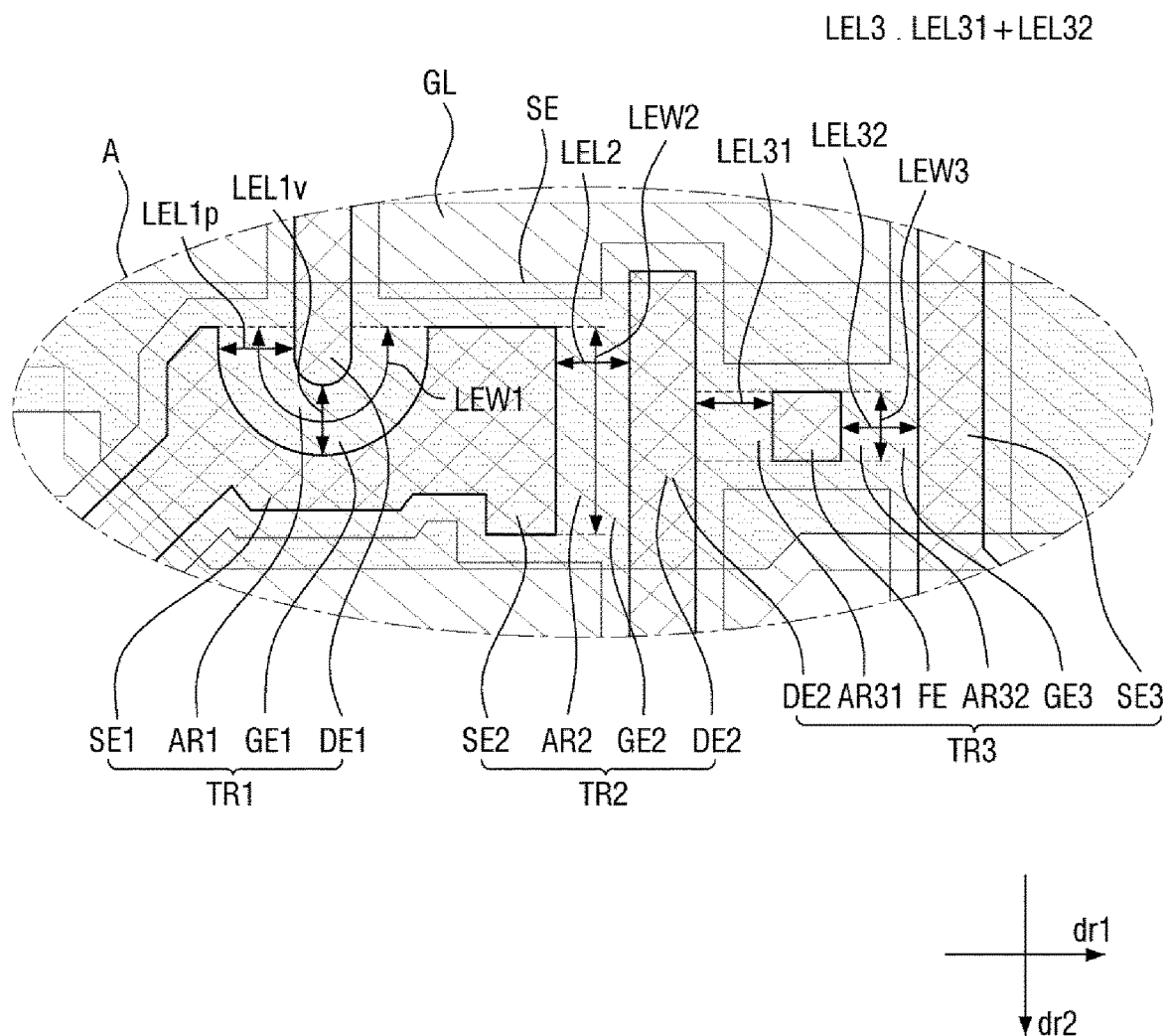
FIG. 5 is an enlarged plan view of an area A of FIG. 1.

FIG. 1 is a plan view of an exemplary embodiment of a pixel of a liquid crystal display ("LCD") device according to the invention, FIG. 2 is a cross-sectional view taken along line I-I' of FIG. 1, FIG. 3 is a cross-sectional view taken along line II-II' of FIG. 1, FIG. 4 is a cross-sectional view taken along line III-III' of FIG. 1, and FIG. 5 is an enlarged plan view of an area A of FIG. 1.

Referring to FIGS. 1 through 5, the LCD device may include a first display substrate 100, a second display substrate 200, and a liquid crystal layer 300.

Switching elements for controlling the alignment of liquid crystal molecules LC disposed in the liquid crystal layer 300, such as, for example, first, second, and third thin-film transistors ("TFTs") TR1, TR2, and TR3, may be disposed on the first display substrate 100. The second display substrate 200 is a substrate disposed to face the first display substrate 100.

The liquid crystal layer 300 may be interposed between the first and second display substrates 100 and 200 and may include a plurality of liquid crystal molecules LC having dielectric anisotropy. In response to an electric field being applied between the first and second display substrates 100 and 200, the liquid crystal molecules LC may rotate in a particular direction between the first and second display substrates 100 and 200 and may thus transmit or block transmission of light therethrough. Hereinafter, the term "rotation" means not only the actual rotation of the liquid crystal molecules LC, but also the change of the alignment of the liquid crystal molecules LC by the electric field.

The LCD device includes a plurality of pixels PX, which are arranged in a matrix form. The plurality of pixels PX may be basic units for displaying colors, and the gray levels of the plurality of pixels PX may be independently controllable. Each of the plurality of pixels PX includes first and second light-transmitting areas PNA1 and PNA2, which actually display colors by transmitting light incident thereupon from below the first display substrate 100 therethrough so as for the light to travel toward the top of the second display substrate 200.

The first display substrate 100 will hereinafter be described.

The first display substrate 100 may include a first base substrate 110. The first base substrate 110 may be a transparent insulating substrate. In an exemplary embodiment, for example, the first base substrate 110 may be a glass substrate, a quartz substrate, a transparent resin substrate, or the like.

In some exemplary embodiments, the first base substrate 110 may be curved in one direction. In some other exemplary embodiments, the first base substrate 110 may have flexibility. That is, the first base substrate 110 may be rollable, foldable, or bendable in the exemplary embodiments.

A gate line GL, a first gate electrode GE1, a second gate electrode GE2, a third gate electrode GE3, a first sustain electrode CST1, and a second sustain electrode CST2 may be disposed on the first base substrate 110.

The gate line GL transmits a gate voltage, which controls the first, second, and third TFTs TR1, TR2, and TR3. The gate line GL may extend in a first direction dr1.

The first direction dr1, which is a direction intersecting a second direction dr2 (described later), may be a direction extending in parallel to one side of the first base substrate 110 on a plane where the first base substrate 110 is disposed, and may be defined as, but is not limited to, a direction indicated by an arbitrary straight line extending from the left to the right of FIG. 1. The second direction dr2 may be defined as a direction indicated by an arbitrary straight line extending from the top to the bottom of FIG. 1. However, the first and second directions dr1 and dr2 are not limited thereto. In some exemplary embodiments, directions, indicated by two arbitrary straight lines extending to intersect perpendicular to each other over the plane where the first base substrate 110 is disposed, may be defined as the first and second directions dr1 and dr2.

The gate voltage may be provided from outside of the LCD device and may have a variable level. The turning on/off of the first, second, and third TFTs TR1, TR2, and TR3 may be controlled according to the level of the gate voltage.

The first, second, and third gate electrodes GE1, GE2, and GE3 may be disposed to protrude from the gate line GL and may be physically connected to the gate line GL. The first, second, and third gate electrodes GE1, GE2, and GE3 may be the elements of the first, second, and third TFTs TR1, TR2, and TR3, respectively.

In some exemplary embodiments, in a case where the first, second, and third gate electrodes GE1, GE2, and GE2 are disposed adjacent to one another, as illustrated in FIG. 1, the first, second, and third gate electrodes GE1, GE2, and GE2 may be integrally disposed as a single protrusion from the gate line GL.

The first and second sustain electrodes CST1 and CST2 are disposed on the first base substrate 110 and may be positioned in the same layer as the gate line GL. The first and second sustain electrodes CST1 and CST2 generally extend in the first direction dr1, but may include portions extending to the boundaries of the first and second light-transmitting areas PNA1 and PNA2.

The first sustain electrode CST1, unlike the second sustain electrode CST2, may be connected to a pair of adjacent two pixels PX arranged along the first direction dr1. That is, the first sustain electrode CST1 may extend across multiple pixels PX along the first direction dr1, and a voltage may be transmitted to each of the multiple pixels PX via the first sustain electrode CST1. The second sustain electrode CST2 may be electrically connected to the first sustain electrode CST1 via a third contact hole CNT3, a fourth contact hole CNT4, and a third source electrode SE3 (described later), and may receive a voltage from the first sustain electrode CST1.

The first sustain electrode CST1 may provide a sustain voltage received from the outside to the third TFT TR3 (described later). The sustain voltage may have a uniform level and may be lower than the maximum level of a data voltage, which is provided to a data line DL, and higher than the minimum level of the data voltage.

The first sustain electrode CST1 may be disposed adjacent to, or overlap with a first sub-pixel electrode SPE1 (described later), and a predetermined capacitance may be formed between the first sub-pixel electrode SPE1 and the first sustain electrode CST1. Accordingly, a sudden drop of the voltage provided to the first sub-pixel electrode SPE1 can be effectively prevented.

Similarly, the second sustain electrode CST2 may be disposed adjacent to, or overlap with a second sub-pixel electrode SPE2 (described later), and a predetermined capacitance may be formed between the second sub-pixel electrode SPE2 and the second sustain electrode CST2. Accordingly, a sudden drop of the voltage provided to the second sub-pixel electrode SPE2 can be effectively prevented.

The gate line GL, the first, second, and third gate electrodes GE1, GE2, and GE3, and the first and second sustain electrodes CST1 and CST2 may include the same material. In an exemplary embodiment, for example, the gate line GL, the first, second, and third gate electrodes GE1, GE2, and GE3, and the first and second sustain electrodes CST1 and CST2 may include an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), tantalum (Ta), or titanium (Ti). The gate line GL, the first, second, and third gate electrodes GE1, GE2, and GE3, and the first and second sustain electrodes CST1 and CST2 may have a single-layer structure or may have a multilayer structure including at least two conductive films having different physical properties.

A first insulating layer 120 is disposed on the gate line GL, the first, second, and third gate electrodes GE1, GE2, and GE3, and the first and second sustain electrodes CST1 and CST2. In an exemplary embodiment, the first insulating layer 120 may be formed of an insulating material such as, for example, silicon nitride or silicon oxide. The first insulating layer 120 may have a single-layer structure or may have a multilayer structure including at least two insulating films having different physical properties.

A semiconductor layer SM may be disposed on the first insulating layer 120. The semiconductor layer SM may overlap at least partially with the first, second, and third gate electrodes GE1, GE2, and GE3. The semiconductor layer SM may include amorphous silicon, polycrystalline silicon, or an oxide semiconductor.

The semiconductor layer SM may overlap not only with the first, second, and third gate electrodes GE1, GE2, and GE3, but also with the data line DL, first, second, and third source electrodes SE1, SE2, and SE3, and first and second drain electrodes DE1 and DE2 (described later). The semiconductor SM and the data line DL may be disposed to overlap with each other because the layer in which the semiconductor layer SM and the data line DL are disposed is fabricated using a single mask (not illustrated). In a case where the semiconductor SM and the data line DL are disposed in different layers using different masks, the semiconductor layer SM may not overlap with the data line DL.

Although not specifically illustrated, in some exemplary embodiments, part of the region where the first, second, and third TFTs TR1, TR2, and TR3 are disposed may be doped with a high concentration of n- or p-type impurities. This doped region may be omitted in a case where the semiconductor layer SM comprises an oxide semiconductor.

The data line DL, the first, second, and third source electrodes SE1, SE2, and SE3, and the first and second drain electrodes DE1 and DE2 may be disposed on the semiconductor layer SM and the first insulating layer 120.

The data line DL may extend in the second direction dr2 to intersect the gate line GL.

The data line DL may be insulated from the gate line GL, the first, second, and third gate electrodes GE1, GE2, and GE3, and the first and second sustain electrodes CST1 and CST2 by the first insulating layer 120.

The data line DL may provide the data voltage to the first and second source electrodes SE1 and SE2. The data voltage may be provided from the outside of the LCD device and may have a variable level. The gray levels of the plurality of pixels PX may vary according to the level of the data voltage.

The first source electrode SE1 may be branched from the data line DL such that at least part thereof may overlap with the first gate electrode GE1. Accordingly, the first source electrode SE1 may receive the data voltage from the data line DL.

The second source electrode SE2 may be branched from the data line DL such that at least part thereof may overlap with the second gate electrode GE2, but the invention is not limited thereto. Alternatively, as illustrated in FIG. 1, the second source electrode SE2 may be branched from the first source electrode SE1 to receive the data voltage from the first source electrode SE1.

The third source electrode SE3 may be physically spaced apart, and electrically insulated, from the data line DL. As illustrated in FIG. 1, the third source electrode SE3 may be connected to the first sustain electrode CST1 via the third contact hole CNT3, which passes through the first insulating layer 120, and may partially overlap with the third gate electrode GE3. Accordingly, the third source electrode SE3 may receive the sustain voltage from the first sustain electrode CST1.

As illustrated in FIG. 1, the first drain electrode DE1 may be spaced apart from the first source electrode SE1 with the semiconductor layer SM disposed therebetween and may at least partially overlap with the first gate electrode GE1. A partial region, of the semiconductor layer SM, disposed between the first drain electrode DE1 and the first source electrode SE1 may be defined as a first active region AR1. In the first active region AR1, a first channel may be formed such that the first drain electrode DE1 and the first source electrode SE1 can be electrically connected to each other according to the gate voltage. The first channel may be controlled by the gate voltage provided to the first gate electrode GE1. The first drain electrode DE1 may be disposed to be a predetermined distance apart from, and surrounded by, the first source electrode SE1 having a U shape.

As illustrated in FIG. 1, the second drain electrode DE2 may be spaced apart from the second source electrode SE2 with the semiconductor layer SM disposed therebetween and may at least partially overlap with the second gate electrode GE2. Also, as illustrated in FIG. 1, the second drain electrode DE2 may be spaced apart from the third source electrode SE3 with the semiconductor layer SM disposed therebetween and may at least partially overlap with the third gate electrode GE3.

That is, the second drain electrode DE2 may be supplied with voltages from both the second and third source electrodes SE2 and SE3. Accordingly, the second drain electrode DE2 may have a voltage level between the data voltage provided to the second source electrode SE2 and the sustain voltage provided to the third source electrode SE3.

The second drain electrode DE2 serves as the output terminal of the second TFT TR2, which has the second source electrode SE2 as an input terminal and the second gate electrode GE2 as a control terminal thereof. Also, the second drain electrode DE2 serves as the output terminal of the third TFT TR3, which has the third source electrode SE3 as an input terminal and the third gate electrode GE3 as a control terminal thereof. In other words, the output terminals of the second and third TFTs TR2 and TR3 are integrally provided by the second drain electrode DE2. This means that the second drain electrode DE2 functions not only as the output terminal of the second TFT TR2, but also as the output terminal of the third TFT TR3. In other words, the second and third TFTs TR2 and TR3 may share the same output terminal together. That the output terminals of the second and third TFTs TR2 and TR3 are integrally provided by the second drain electrode DE2 may also mean that the second and third source electrodes SE2 and SE3 are disposed on opposite sides of the second drain electrode DE2.

The second drain electrode DE2 may be a predetermined distance apart from each of the second and third source electrodes SE2 and SE3 and may be disposed in parallel to the second and third source electrodes SE2 and SE3. Specifically, each of the second drain electrode DE2 and the second and third source electrodes SE2 and SE3 may have one or more outer sides extending in the second direction dr2, and second and third active regions AR2 and AR3 may be disposed between the outer sides of the second drain electrode DE2 and the second source electrode SE2 and between the outer sides of the second drain electrode DE2 and the third source electrode SE3, respectively. The third active region AR3 includes a first part of the third active region AR31 and a second part of the third active region AR32. In other words, as illustrated in FIGS. 1 and 5, the second source electrode SE2, the second active region AR2, the second drain electrode DE2, the third active region AR3, and the third source electrode SE3, which extend along the second direction dr2, may be sequentially disposed in that order. In other words, the second and third active regions AR2 and AR3 may be disposed on opposite sides of the second drain electrode DE2.

As illustrated in FIGS. 1 and 5, the second drain electrode DE2 may be spaced apart from the second source electrode SE2 with the semiconductor layer SM disposed therebetween and may at least partially overlap with the second gate electrode GE2. A partial region, of the semiconductor layer SM, disposed between the second drain electrode DE2 and the second source electrode SE2 may be defined as the second active region AR2. In the second active region AR2, a second channel may be formed such that the second drain electrode DE2 and the second source electrode SE2 can be electrically connected to each other according to the gate voltage. The second channel may be controlled by the gate voltage provided to the second gate electrode GE2.

Also, as illustrated in FIGS. 1 and 5, the second drain electrode DE2 may be spaced apart from the third source electrode SE3 with the semiconductor layer SM disposed therebetween and may at least partially overlap with the third source electrode SE3. A partial region, of the semiconductor layer SM, disposed between the second drain electrode DE2 and the third source electrode SE3 may be defined as the third active region AR3. In the third active region AR3, a third channel may be formed such that the second drain electrode DE2 and the third source electrode SE3 can be electrically connected to each other according to the gate voltage. The third channel may be controlled by the gate voltage provided to the third gate electrode GE3.

In the exemplary embodiment of FIGS. 1 through 5, a floating electrode FE, which extends along the second direction dr2 inside the third active region AR3, may be additionally disposed in order to improve the characteristics of the third TFT TR3.

The first drain electrode DE1 may be electrically connected to the first sub-pixel electrode SPE1 via a first contact hole CNT1 (described later). The second drain electrode DE2 may be electrically connected to the second sub-pixel electrode SPE2 via a second contact hole CNT2 (described later).

The third source electrode SE3 may be electrically connected to the first sustain electrode CST1 via the third contact hole CNT3 and may also be electrically connected to the second sustain electrode CST2 via the fourth contact hole CNT4. Accordingly, the sustain voltage provided to the first sustain electrode CST1 may be transmitted to the second sustain electrode CST2 via the third source electrode SE3.

The data line DL, the first, second, and third source electrodes SE1, SE2, and SE3, and the first and second drain electrodes DE1 and DE2 may include the same material. In an exemplary embodiment, for example, the data line DL, the first, second, and third source electrodes SE1, SE2, and SE3, and the first and second drain electrodes DE1 and DE2 may include an Al-based metal such as Al or an Al alloy, a Ag-based metal such as Ag or an Ag alloy, a Cu-based metal such as Cu or a Cu alloy, a Mo-based metal such as Mo or a Mo alloy, Cr, Ta, or Ti. The data line DL, the first, second, and third source electrodes SE1, SE2, and SE3, and the first and second drain electrodes DE1 and DE2 may have a single-layer structure or may have a multilayer structure including at least two conductive films having different physical properties.

The first gate electrode GE1, the first active region AR1, the first source electrode SE1, and the first drain electrode DE1 may form the first TFT TR1 which functions as a switching element. The second gate electrode GE2, the second active region AR2, the second source electrode SE2, and the second drain electrode DE2 may form the second TFT TR2 which functions as a switching element. The third gate electrode GE3, the third active region AR3, the third source electrode SE3, and the second drain electrode DE2 may form the third TFT TR3 which also functions as a switching element. That is, the second and third TFTs TR2 and TR3 may share the second drain electrode DE2 as their output terminal.

In a case where the gate voltage provided to the first gate electrode GE1 has an on-level capable of turning on the first TFT TR1, the data voltage provided to the data line DL may be provided to the first drain electrode DE1 via the first source electrode SE1. Since the first drain electrode DE1 is electrically connected to the first sub-pixel electrode SPE1, the data voltage provided to the data line DL may also be provided to the first sub-pixel electrode SPE1.

In a case where the gate voltage provided to the second gate electrode GE2 has an on=level capable of turning on the second TFT TR2, the data voltage provided to the data line DL may be provided to the second drain electrode DE2 via the second source electrode SE2. In a case where the gate voltage provided to the third gate electrode GE3 has an on-level capable of turning on the third TFT TR3, the sustain voltage provided to the first sustain electrode CST1 may be provided to the second drain electrode DE2 via the third source electrode SE3.

As mentioned above, since the second drain electrode DE2 is electrically connected to the second sub-pixel electrode SPE2 via the second contact hole CNT2 and the sustain voltage is lower than the data voltage, the voltage provided to the second sub-pixel electrode SPE2 may have a level between the data voltage and the sustain voltage.

Even though a single voltage is provided to each of the plurality of pixels PX, the voltage finally provided to the first sub-pixel electrode SPE1 may differ from the voltage finally provided to the second sub-pixel electrode SPE2, and as a result, the liquid crystal molecules LC may be tilted at various angles. Accordingly, the difference between the gray level of the LCD device as viewed from the front and the gray level of the LCD device as viewed from a side can be minimized. In other words, the visibility of the LCD device can be improved.

The voltage finally provided to the second sub-pixel electrode SPE2, i.e., the voltage provided to the second drain electrode DE2, may be calculated by Equations (1) and (2):

$$Vdr2 = Rv \times Vdata \quad (1); \text{ and}$$

$$Rv = \frac{LEW2/LEL2}{LEW2/LEL2 + LEW3/(LEL31 + LEL32)} \quad (2)$$

where Vdr2 denotes the voltage applied to the second drain electrode DE2, Vdata denotes the data voltage, RV denotes voltage ratio, LEW2 denotes the width of the second channel formed in the second active region AR2, LEL2 denotes the length of the second channel formed in the second active region AR2, LEW3 denotes the width of the third channel formed in the third active region AR3, and LEL31+LEL32 denotes the length LEL3 of the third channel formed in the third active region AR3.

The length of a channel corresponds to the degree to which two electrodes disposed on both sides of the channel are spaced apart from each other, and the width of a channel corresponds to the degree to which two electrodes disposed on both sides of the channel face each other.

The length of the three channels will hereinafter be described with reference to FIG. 5. Referring to FIG. 5, the floating electrode FE is disposed near the center of the third active region AR3. Accordingly, no channel is formed in the region where the floating electrode FE is disposed, and the region where the floating electrode FE is disposed may have conductivity. In other words, the region where the floating electrode FE is disposed may be excluded from the third active region AR3. Thus, the third active region AR3 is divided into first and second areas on the left and right sides, respectively, of the floating electrode FE, and the length of the third channel LEL 3 may be defined as the sum of a length LEL31, in the first direction dr1, of the first area and a length LEL32, in the second direction dr1, of the second area.

In the exemplary embodiments of FIGS. 1 through 5, as illustrated in FIG. 5, both the length LEL2 of the second channel and the length LEL3 of the third channel may be measured along the first direction dr1. In other words, the direction of the length LEL2 of the second channel may be the same as the first direction dr1, and the direction of the length LEL3 of the third channel may also be the same as the first direction dr1. In addition, the direction of the length LEL2 of the second channel may be the same as the direction in which the gate line GL is extends, and the direction of the length LEL3 of the third channel may also be the same as the direction in which the gate line GL extends. Accordingly, deviations in the length LEL2 of the second channel between the plurality of pixels PX may be effectively minimized.

Both the length LEL2 of the second channel and the length LEL3 of the third channel are in the denominator of Equation (2). Thus, if the length LEL2 of the second channel and the length LEL3 of the third channel differ from each other, i.e., if there is a large deviation between the length LEL2 of the second channel and the length LEL3 of the third channel, the voltage ratio may considerably vary from one pixel PX to another pixel PX. As a result, even if the same data voltage and the same sustain voltage are provided to each of the plurality of pixels PX, the voltage provided to the second sub-pixel electrode SPE2 via the second drain electrode DE2 may vary from one pixel PX to another pixel PX. However, since both the direction of the length LEL2 of the second channel and the direction of the length LEL3 of the third channel are the same as the first direction dr1, deviations in voltage ratio between the plurality of pixels PX can be effectively minimized. This will hereinafter be described with reference to FIG. 6.

Figure 6:
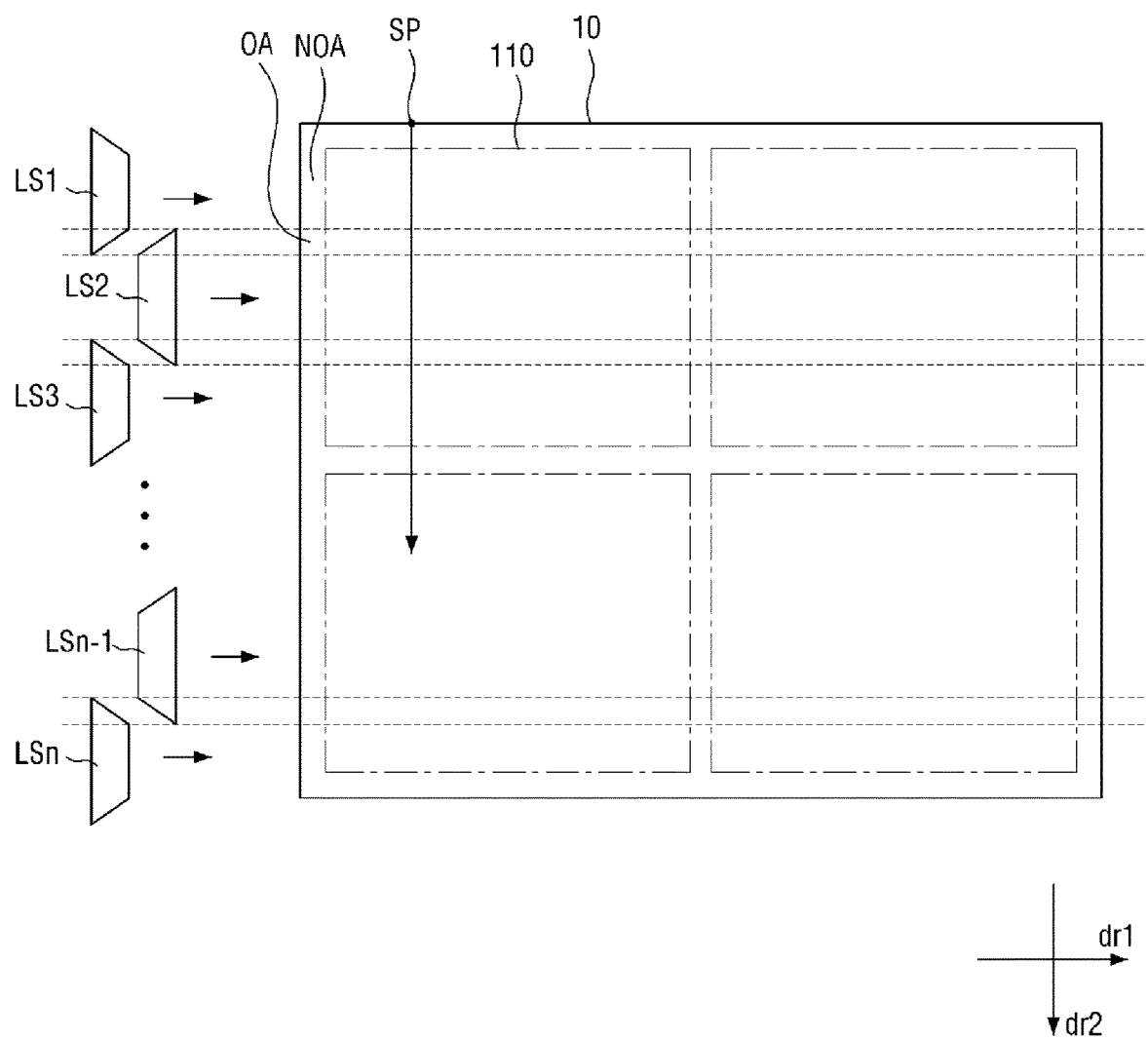
FIG. 6 is a schematic view illustrating how to expose a mother substrate using an exposure apparatus.

FIG. 6 is a schematic view illustrating how to expose a mother substrate using an exposure apparatus.

A method of formation of various wirings (e.g., the data line DL, the first, second, and third source electrodes SE1, SE2, and SE3, and the first and second drain electrodes DE1 and DE2) may include forming a metal layer, forming a photoresist layer on the metal layer, curing the photoresist layer by applying ultraviolet ("UV") light using an exposure apparatus, removing part of the photoresist layer, removing (i.e., etching away) part of the metal layer that is exposed, and removing the rest of the photoresist layer.

Referring to FIG. 6, the exposure apparatus may apply UV light to a mother substrate 10 to cure the photoresist layer to have particular patterns. The exposure apparatus uses a plurality of lenses LS1 through LSn to form the particular patterns on the photoresist layer, and due to the use of the lenses LS1 through LSn, the patterns formed on the photoresist layer may become more sophisticated. The mother substrate 10 may be a substrate yet to be divided or cut into an individual base substrate 110.

The lenses LS1 through LSn apply UV light to the photoresist layer while moving from one side to the other side of the mother substrate 10. In the exemplary embodiment of FIG. 6, the lenses LS1 through LSn apply UV light while moving from the left to the right of FIG. 6 along the first direction dr1.

The lenses LS1 through LSn, which are disposed adjacent to one another, may be trapezoidal, and each pair of adjacent lenses may be oriented in opposite directions. The amount of UV light applied to the mother substrate 10 via the lenses LS1 through LSn may be substantially uniform in overlapping areas OA where two adjacent lenses overlap with each other and in non-overlapping areas NOA where the UV light is applied to the mother substrate 10 through only one lens. In other words, all the lenses LS1 through LSn have the same height in the non-overlapping areas NOA, and the sum of the heights of the trapezoidal shapes of each pair of adjacent lenses in anywhere of the overlapping areas NOA may be the same as the height of the trapezoidal shapes of the lenses LS1 through LSn in the non-overlapping areas NOA. The lenses LS1 through LSn are illustrated in FIG. 6 as having a trapezoidal cross-sectional shape, but the shape of the lenses LS1 through LSn is not particularly limited thereto as long as the amount of UV light applied via the lenses LS1 through LSn is uniform anywhere. The width to which each of the lenses LS1 through LSn applies UV light may be about 100 to about 110 mm, but the invention is not limited thereto. That is, various sizes of lenses may be used.

Since the lenses LS1 through LSn form patterns on the photoresist layer by applying UV light while moving along the first direction dr1, the patterns formed in the first direction dr1 may be more sophisticated than the patterns formed in the second direction dr2. Accordingly, in a case where the direction of the length LEL2 of the second channel and the direction of the length LEL3 of the third channel are identical to the first direction dr1, accuracy of the lengths LEL2 and LEL3 can increase, and deviations in the length LEL2 of the second channel and the length LEL3 of the third channel between the plurality of pixels PX can be effectively minimized.

The formation of patterns may be more difficult in the overlapping areas OA than in the non-overlapping areas NOA. However, even in the overlapping areas OA, if the direction of the length LEL2 of the second channel and the direction of the length LEL3 of the third channel are identical to the first direction dr1, deviations in the length LEL2 of the second channel and the length LEL3 of the third channel between the plurality of pixels PX can be effectively minimized.

Referring again to FIGS. 1 through 5, in order to make both the second and third channels extend in the first direction dr1, the second source electrode SE2, the second drain electrode DE2, and the third source electrode SE3, which are disposed adjacent to the second and third active regions AR2 and AR3, may have bar-shaped portions extending along the second direction dr2.

On the other hand, a width LEW1 of the first channel formed in the first active region AR1 is measured as a length of a U-shape contour of the first channel. The length of the first channel includes both a length LEL1$v$ which is a distance to which a side of the first drain electrode DE1 and a side of the first source electrode SE1 facing each other are spaced apart in a vertical direction, and a length LEL1$p$ which is a distance to which a side of the first drain electrode DE1 and a side of the first source electrode SE1 facing each other are spaced apart in a vertical direction. Since the first TFT TR1, including the first active region AR1, transmits only the data voltage to the first sub-pixel electrode SPE1, the voltage applied to the first sub-pixel electrode SPE1 may not be affected considerably by any deviations in the length LEL1$v$, in the vertical direction, of the first channel. In other words, even though the first channel has both the length LEL1$v$ in the vertical direction and the length LEL1$p$ in the horizontal direction, the display quality of the LCD device may not be degraded according to the deviation.

On the other hand, in a case where the second and third TFTs TR2 and TR3 include bar-shaped second and third active regions AR2 and AR3, the overlapping areas between the second source electrode SE2, the third source electrode SE3, and the second drain electrode DE2 and the second and third gate electrodes GE2 and GE3 may be relatively small, compared to a case where the second and third TFTs TR2 and TR3 include U-shaped second and third active regions AR2 and AR3. Accordingly, the capacitances formed between the second source electrode SE2, the third source electrode SE3, and the second drain electrode DE2 and the second and third gate electrodes GE2 and GE3 may also be small. As a result, the charging rate of the second and third TFTs TR2 and TR3 can be enhanced, and driving margins can be improved.

In the case where the second and third TFTs TR2 and TR3 include bar-shaped second and third active regions AR2 and AR3, a kickback phenomenon, i.e., the phenomenon in which the data voltage that the second drain electrode DE2 is charged with suddenly drops in response to the transition of the gate voltage from an on-level to an off-level, may become severe, as compared to the case where the second and third TFTs TR2 and TR3 include U-shaped second and third active regions AR2 and AR3. However, in the exemplary embodiment of FIGS. 1 through 5 according to the invention, since the second and third TFTs TR2 and TR3 share the second drain electrode DE2 as their output terminals, the overlapping areas between the output terminals of the second and third TFTs TR2 and TR3 and the second and third gate electrodes GE2 and GE3 can be effectively minimized, and as a result, the kickback phenomenon can also be effectively minimized.

A second insulating layer 130 is disposed on the first insulating layer 120 and the first, second, and third TFTs TR1, TR2, and TR3. The second insulating layer 130 may include an insulating material. In an exemplary embodiment, for example, the second insulating layer 130 may be an organic layer comprising an organic material. The second insulating layer 130 may planarize any height differences provided by elements disposed between the second insulating layer 130 and the first base substrate 110 on the top surface thereof. In other words, the top surface of the second insulating layer 130 may be substantially flat.

The first, second, third, and fourth contact holes CNT1, CNT2, CNT3, and CNT4 may be defined in the second insulating layer 130 to penetrate the second insulating layer 130.

Specifically, the first contact hole CNT1, which exposes part of the first drain electrode DE1 along a vertical direction with respect to the top surface of the first base substrate 110, may be defined in the second insulating layer 130. Part of the first drain electrode DE1 and the first sub-pixel electrode SPE1 which is disposed above the second insulating layer 130 may be physically connected to each other via the first contact hole CNT1.

Also, the second contact hole CNT2, which exposes part of the second drain electrode DE2 along the vertical direction with respect to the top surface of the first base substrate 110, may be defined in the second insulating layer 130. Part of the second drain electrode DE2 and the second sub-pixel electrode SPE2 which is disposed above the second insulating layer 130 may be electrically connected to each other via the second contact hole CNT2.

Also, the third contact hole CNT3, which exposes part of the first sustain electrode CST1 and part of the third source electrode SE3 along the vertical direction with respect to the top surface of the first base substrate 110, may be defined in the second insulating layer 130. A first bridge electrode BE1 may be disposed on the second insulating layer 130 to overlap with the third contact hole CNT3 and may electrically connect the first sustain electrode CST1 and the third source electrode SE3.

Also, the fourth contact hole CNT4, which exposes part of the second sustain electrode CST2 and part of the third source electrode SE3 along the vertical direction with respect to the top surface of the first base substrate 110, may be defined in the second insulating layer 130. A second bridge electrode BE2 may be disposed on the second insulating layer 130 to overlap with the fourth contact hole CNT4 and may electrically connect the second sustain electrode CST2 and the third source electrode SE3.

The first sub-pixel electrode SPE1, the second sub-pixel electrode SPE2, the first bridge electrode BE1, the second bridge electrode BE2, and a shielding electrode SDE are disposed on the second insulating layer 130 not to overlap with one another over the same plane.

The first sub-pixel electrode SPE1 may be electrically connected to the first drain electrode DE1 via the first contact hole CNT1 and may receive the data voltage from the first drain electrode DE1.

The second sub-pixel electrode SPE2 may be electrically connected to the second drain electrode DE2 via the second contact hole CNT2 and may receive a voltage having a level between the data voltage and the sustain voltage from the second drain electrode DE2.

The first sub-pixel electrode SPE1 may be generally disposed within a first light-transmitting area PNA1 but may include an extended portion overlapping with the first contact hole CNT1 for connection with the first drain electrode DE1. Also, the first sub-pixel electrode SPE1 may define openings in which no transparent conductive material is disposed. Due to the presence of the openings, regular patterns are provided on the first sub-pixel electrode SPE1, and the tilt direction and tilt degree of liquid crystal molecules LC disposed to overlap with the first sub-pixel electrode SPE1 may be controlled by the shape and the patterns of the first sub-pixel electrode SPE1. In the exemplary embodiments of FIGS. 1 through 5, the first sub-pixel electrode SPE1 may have patterns including a plurality of branches extending outwardly from the center of the first light-transmitting area PNA1, but the invention is not limited thereto.

Similarly, the second sub-pixel electrode SPE2 may be generally disposed within a second light-transmitting area PNA2 but may include an extended portion overlapping with the second contact hole CNT2 for connection with the second drain electrode DE2. Also, the second sub-pixel electrode SPE2 may define openings in which no transparent conductive material is disposed. Due to the presence of the openings, regular patterns are provided on the second sub-pixel electrode SPE2, and the tilt direction and tilt degree of liquid crystal molecules LC disposed to overlap with the second sub-pixel electrode SPE2 may be controlled by the shape and the patterns of the second sub-pixel electrode SPE2. In the exemplary embodiments of FIGS. 1 through 5, the second sub-pixel electrode SPE2 may have patterns including a plurality of branches extending outwardly from the center of the second light-transmitting area PNA2, but the invention is not limited thereto.

As described above, the first and second bridge electrodes BE1 and BE2 may be disposed to overlap with the third and fourth contact holes CNT3 and CNT4, respectively.

The shielding electrode SDE may be a predetermined distance apart from the first and second sub-pixel electrodes SPE1 and SPE2 and the first and second bridge electrodes BE1 and BE2 so as not to overlap with the first and second sub-pixel electrodes SPE1 and SPE2 and the first and second bridge electrodes BE1 and BE2. Accordingly, the voltages provided to the first and second sub-pixel electrodes SPE1 and SPE2 may not be provided to the shielding electrode SDE.

The shielding electrode SDE may be disposed to overlap with an entire region except for the areas where the first and second sub-pixel electrodes SPE1 and SPE2 and the first and second bridge electrodes BE1 and BE2 are disposed. However, the shielding electrode SDE does not necessarily overlap with the entire region except for the areas where the first and second sub-pixel electrodes SPE1 and SPE2 and the first and second bridge electrodes BE1 and BE2 are disposed, and may overlap with some of the areas where the first and second sub-pixel electrodes SPE1 and SPE2 and the first and second bridge electrodes BE1 and BE2 are disposed.

Specifically, the shielding electrode SDE may be disposed to overlap with the data line DL. The data line DL may be provided with the data voltage and may thus affect the liquid crystal molecules LC, and the shielding electrode SDE may shield the effect of the data voltage to the liquid crystal molecules LC. As a result, light leakage can be prevented.

In an exemplary embodiment, the first and second sub-pixel electrodes SPE1 and SPE2, the first and second bridge electrodes BE1 and BE2, and the shielding electrode SDE may include a transparent conductive material such as indium tin oxide ("ITO"), indium zinc oxide ("IZO"), indium tin zinc oxide ("ITZO"), or aluminum (Al)-doped zinc oxide ("AZO").

A first alignment film (not illustrated) may be additionally disposed on the first and second sub-pixel electrodes SPE1 and SPE2, the first and second bridge electrodes BE1 and BE2, and the shielding electrode SDE. The first alignment film may control the initial alignment angle of the liquid crystal molecules LC injected into the liquid crystal layer 300.

The second display substrate 200 will hereinafter be described.

The second display substrate 200 includes a second base substrate 110, a light-shielding member BM, a color filter layer CF, an overcoat layer 220, and a common electrode CE.

The second base substrate 210 is disposed to face the first base substrate 110. The second base substrate 210 may be durable enough to withstand external shocks. The second base substrate 210 may be a transparent insulating substrate. In an exemplary embodiment, for example, the second base substrate 210 may be a glass substrate, a quartz substrate, a transparent resin substrate, or the like. The second base substrate 210 may have a flat plate shape, but may be curved in a particular direction.

The light-shielding member BM is disposed on a surface of the second base substrate 210 that faces the first display substrate 100.

The light-shielding member BM may be disposed to overlap with the gate line GL, the data line DL, the first, second, and third TFTs TR1, TR2, and TR3, and the first, second, third, and fourth contact holes CNT1, CNT2, CNT3, and CNT4 (i.e., to overlap with an entire region except for the first and second light-transmitting areas PNA1 and PNA2). Accordingly, the transmission of light in the entire region except for the first and second light-transmitting areas PNA1 and PNA2 can be blocked by the light-shielding member BM.

A color filter layer CF is disposed on a surface of the light-shielding member BM that faces the first display substrate 100.

The color filter layer CF may comprise a photosensitive organic composition containing a pigment for implementing a color, and may include any one of red, green, and blue pigments. In an exemplary embodiment, for example, the color filter layer CF may include a plurality of color filters, and one of the plurality of color filters may display one of three primary colors, i.e., red, green, and blue colors. However, the invention is not limited to this example. Alternatively, the plurality of color filters may display any one of cyan, magenta, yellow, and white colors.

In the exemplary embodiments of FIGS. 1 through 5, the color filter layer CF may be provided on the second display substrate 200, but the invention is not limited thereto. That is, in some exemplary embodiments, the color filter layer CF may be provided on the first display substrate 100.

The overcoat layer 220 is disposed on a surface of the color filter layer CF that faces the first display substrate 100. The overcoat layer 220 can alleviate height differences provided by the light-shielding member BM and the color filter layer CF. In some exemplary embodiments, the overcoat layer 220 may be omitted.

A common electrode CE is disposed on a surface of the overcoat layer 220 that faces the first display substrate 100.

The common electrode CE may be provided as an unpatterned plate over the entire surface of the second base substrate 210. A common voltage supplied from the outside may be applied to the common electrode CE to form an electric field in the liquid crystal layer 300 together with the first and second sub-pixel electrodes SPE1 and SPE2. However, in some exemplary embodiments, openings may be defined on the common electrode CE such that the common electrode CE can have particular patterns.

The common voltage may be provided from the outside, and the level of the common voltage may be uniformly maintained while the liquid crystal display is operating. Accordingly, an electric field may be formed by a voltage difference between the first sub-pixel electrode SPE1 and the common electrode CE, which are disposed to overlap with each other, and between the second sub-pixel electrode SPE2 and the common electrode CE, which are disposed to overlap with each other. The liquid crystal molecules LC may be rotated or tilted by the electric field.

On the other hand, in some exemplary embodiments, the shielding electrode SDE may be provided with a voltage having substantially the same level as the common voltage. Accordingly, during the operation of the liquid crystal display device, an electric field having a directionality may not be formed in part of the liquid crystal layer 300 between the shielding electrode SDE and the common electrode CE, which are disposed to overlap with each other. Since a voltage having the same level as the common voltage is provided to the shielding electrode SDE and the common electrode CE, no potential difference is generated therebetween. Accordingly, the liquid crystal molecules LC in the space between the shielding electrode SDE and the common electrode CE, which are disposed to overlap with each other, may not be rotated or tilted, and may be maintained in the same state with the state when the LCD device is turned off. In an exemplary embodiment, for example, the transmission of light can be blocked in the part of the liquid crystal molecules LC between the shielding electrode SDE and the common electrode CE.

A second alignment film (not illustrated) may be disposed on a surface of the common electrode CE that faces the first display substrate 100. The second alignment film, like the first alignment film, may control the initial alignment angle of the liquid crystal molecules LC injected into the liquid crystal layer 300. The second alignment film may be omitted.

The liquid crystal layer 300 will hereinafter be described.

The liquid crystal layer 300 may include the liquid crystal molecules LC having dielectric anisotropy and refractive anisotropy. The liquid crystal molecules LC may be aligned in a vertical direction with respect to the first and second display substrates 100 and 200 in the absence of an electric field in the liquid crystal layer 300. In response to an electric field provided between the first and second display substrates 100 and 200, the liquid crystal molecules LC may be tilted or rotated in a particular direction and may thus change the polarization of light.

Figure 7:
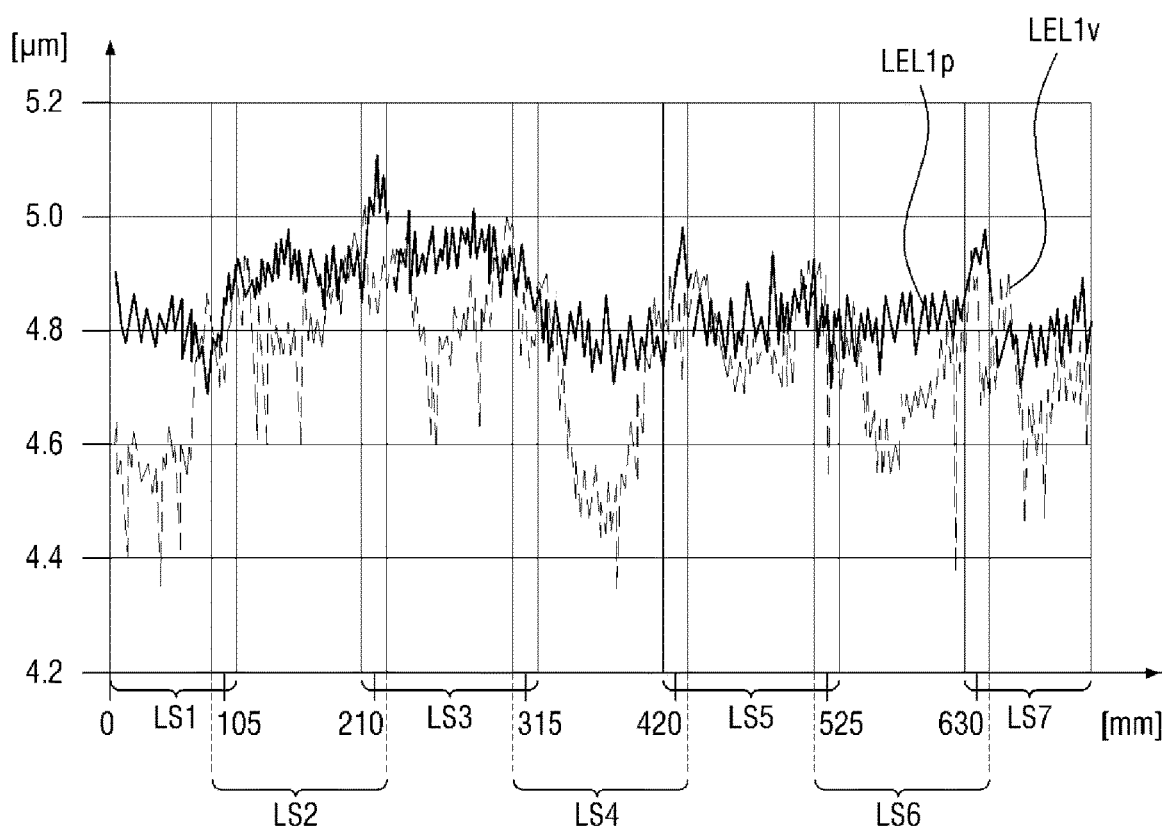
FIG. 7 is a graph showing an exemplary embodiment of measurements of the lengths, in vertical and horizontal directions, of a first channel of a first thin-film transistor ("TFT") according to the LCD device of FIGS. 1 through 5.

FIG. 7 is a graph showing an exemplary embodiment of measurements of the lengths, in vertical and horizontal directions, of the first channel of the first TFT according to the LCD device of FIGS. 1 through 5.

Referring to FIG. 7, the X axis represents the location of each lens (in mm), and the Y axis represents the length of the first channel (in μm). Specifically, the X axis represents the distance, in the second direction dr2, of each lens from a starting point SP of FIG. 6.

FIG. 7 shows that there are large deviations in the length LEL1v, in the vertical direction, of the first channel of the first TFT TR1 between the plurality of pixels PX and there are relatively small deviations in the length LEL1p, in the horizontal direction, of the first channel of the first TFT TR1 between the plurality of pixels PX.

As described above, the first sub-pixel electrode SPE1 may not be considerably affected by deviations in channel length because it receives only the data voltage provided to the data line DL.

On the other hand, if the second and third channels of the second and third TFTs TR2 and TR3 extend in the vertical direction, the difference between the lengths of the second and third channels of the second and third TFTs TR2 and TR3 may considerably affect the voltage provided to the second sub-pixel electrode SPE2. That is, even if the same data voltage and the same sustain voltage are applied, there are large variations in the voltage generated in the second sub-pixel electrode SPE2 between the plurality of pixels PX, and thus, smudges may become visible. However, in the exemplary embodiments of FIGS. 1 through 5, since both the lengths LEL2 and LEL3 of the second and third channels of the second and third TFTs TR2 and TR3 can be measured in the first direction dr1, i.e., the horizontal direction, deviations in voltage between the plurality of pixels PX that may be caused by different channel lengths can be effectively minimized.

Figure 8:
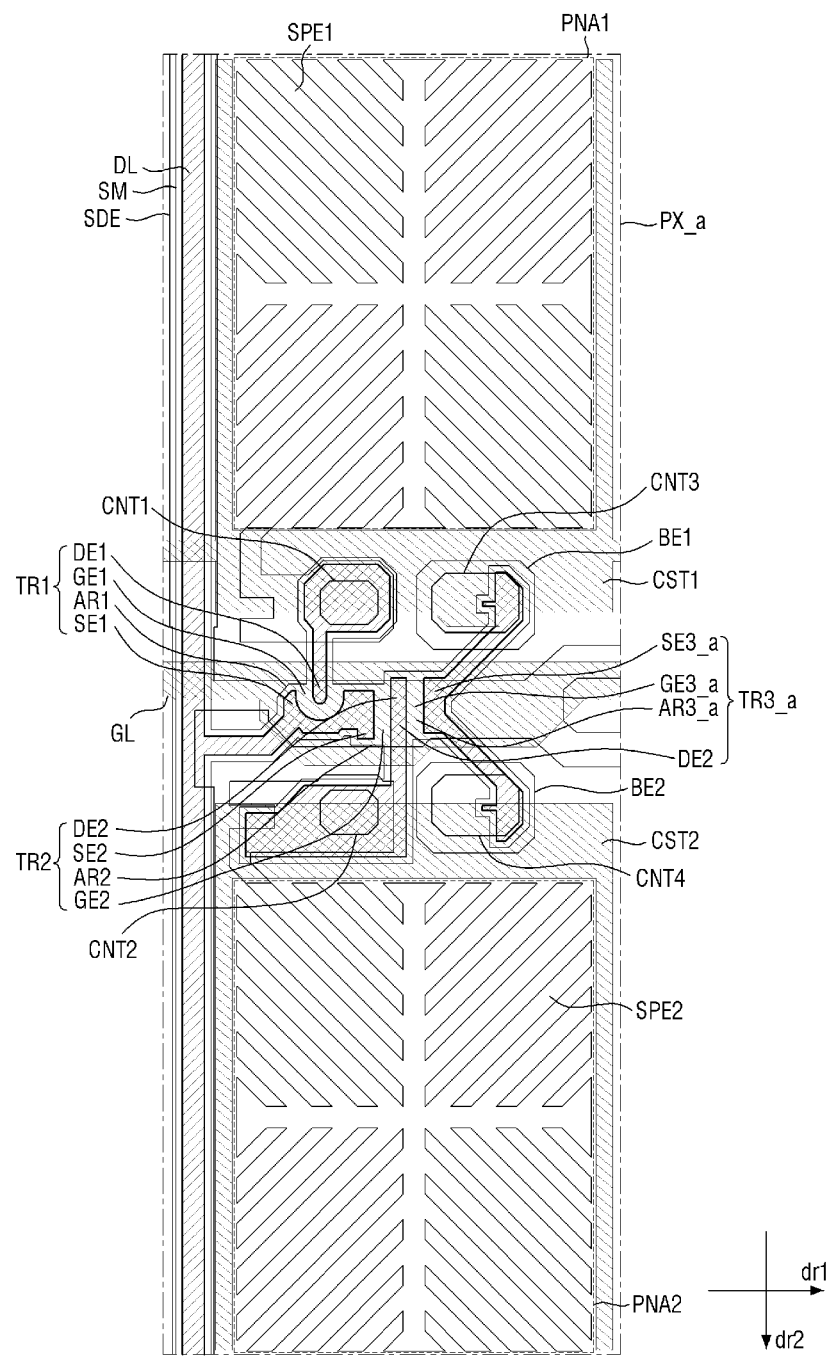
FIG. 8 is a plan view of another exemplary embodiment of a pixel of an LCD device according to the invention.

FIG. 8 is a plan view of another exemplary embodiment of a pixel of an LCD device according to the invention.

A pixel PX_a of FIG. 8 differs from the pixel PX of FIG. 1 in that no floating electrode FE is provided in a third TFT TR3_a. The pixel PX_a will hereinafter be described, focusing mainly on differences with the pixel PX of FIG. 1.

Referring to FIG. 8, the pixel PX_a includes a gate line GL, a semiconductor layer SM, a data line DL, a first TFT TR1, a second TFT TR2, the third TFT TR3_a, a first contact hole CNT1, a second contact hole CNT2, a third contact hole CNT3, a fourth contact hole CNT4, a first sub-pixel electrode SPE1, a second sub-pixel electrode SPE2, a first bridge electrode BE1, a second bridge electrode BE2, and a shielding electrode SDE.

The third TFT TR3_a includes a third source electrode SE3_a, a third gate electrode GE3_a, a third active region AR3_a, and a second drain electrode DE2. That is, the pixel PX_a may not include the equivalent of the floating electrode FE of FIG. 1, which is disposed near the center of the third active region AR3 of the pixel PX of FIG. 1.

Figure 9:
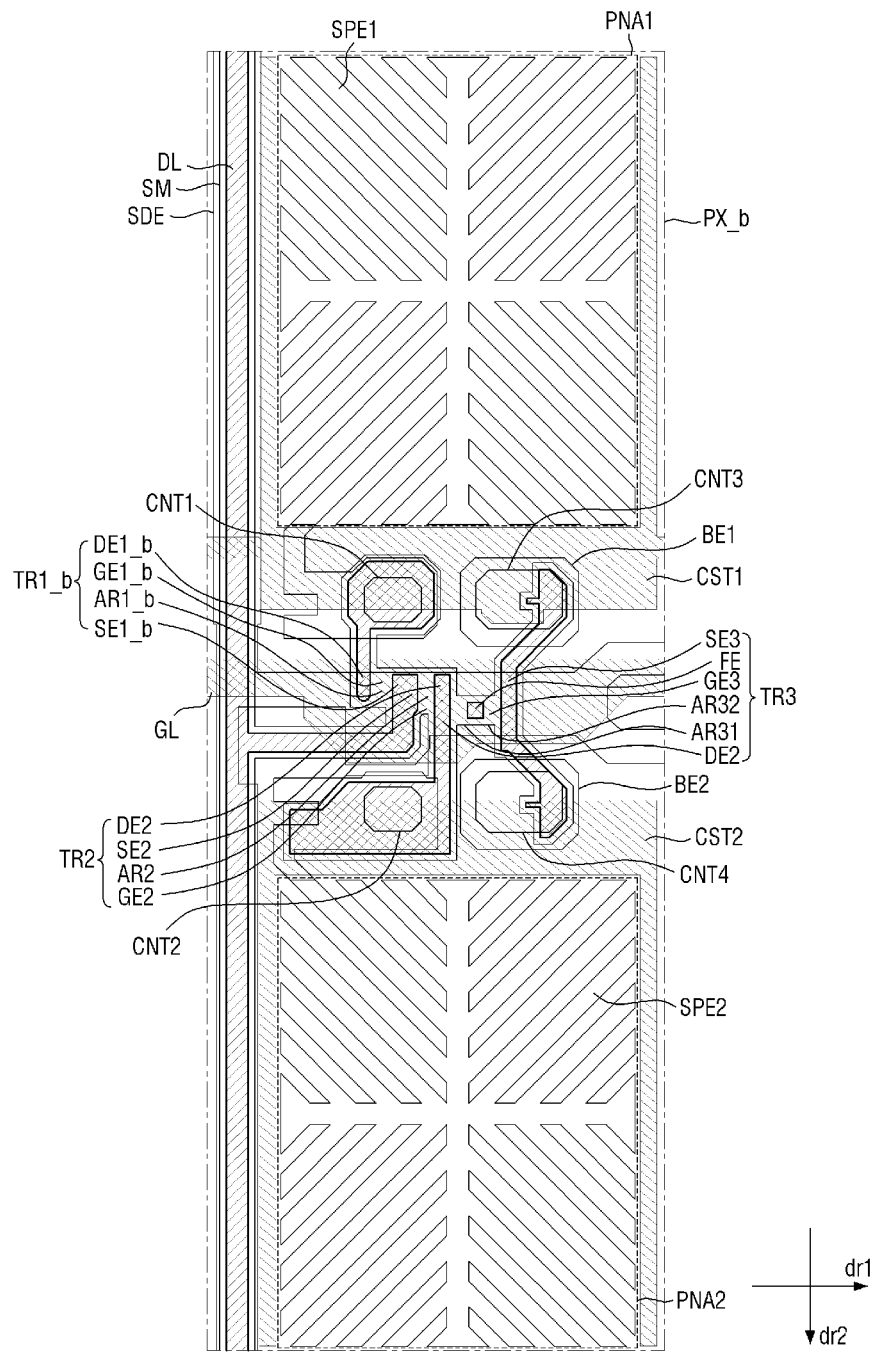
FIG. 9 is a plan view of still another exemplary embodiment of a pixel of an LCD device according to the invention.

FIG. 9 is a plan view of still another exemplary embodiment of a pixel of an LCD device according to the invention.

A pixel PX_b of FIG. 9 differs from the pixel PX of FIG. 1 in that both a first source electrode SE1_b and a first drain electrode DE1_b of a first TFT TR1_b are bar-shaped. The pixel PX_b will hereinafter be described, focusing mainly on differences with the pixel PX of FIG. 1.

Referring to FIG. 9, the pixel PX_b includes a gate line GL, a semiconductor layer SM, a data line DL, a first TFT TR1_b, a second TFT TR2, a third TFT TR3, a first contact hole CNT1, a second contact hole CNT2, a third contact hole CNT3, a fourth contact hole CNT4, a first sub-pixel electrode SPE1, a second sub-pixel electrode SPE2, a first bridge electrode BE1, a second bridge electrode BE2, and a shielding electrode SDE.

The first TFT TR1_b includes the first source electrode SE1_b, the first drain electrode DE1_b, a first active region AR1_b, and a first gate electrode GE1_b. Both the first source electrode SE1_b and the first drain electrode DE1_b, which are adjacent to the first active region AR1_b, maybe provided as a bar shape extending along a second direction dr2. Accordingly, the length of a first channel formed in the first TFT TR1_b may be measured along the first direction dr1. As a result, deviations in the length of the first channel between the pixel PX_b and other pixels PX_b can be effectively minimized.

Figure 10:
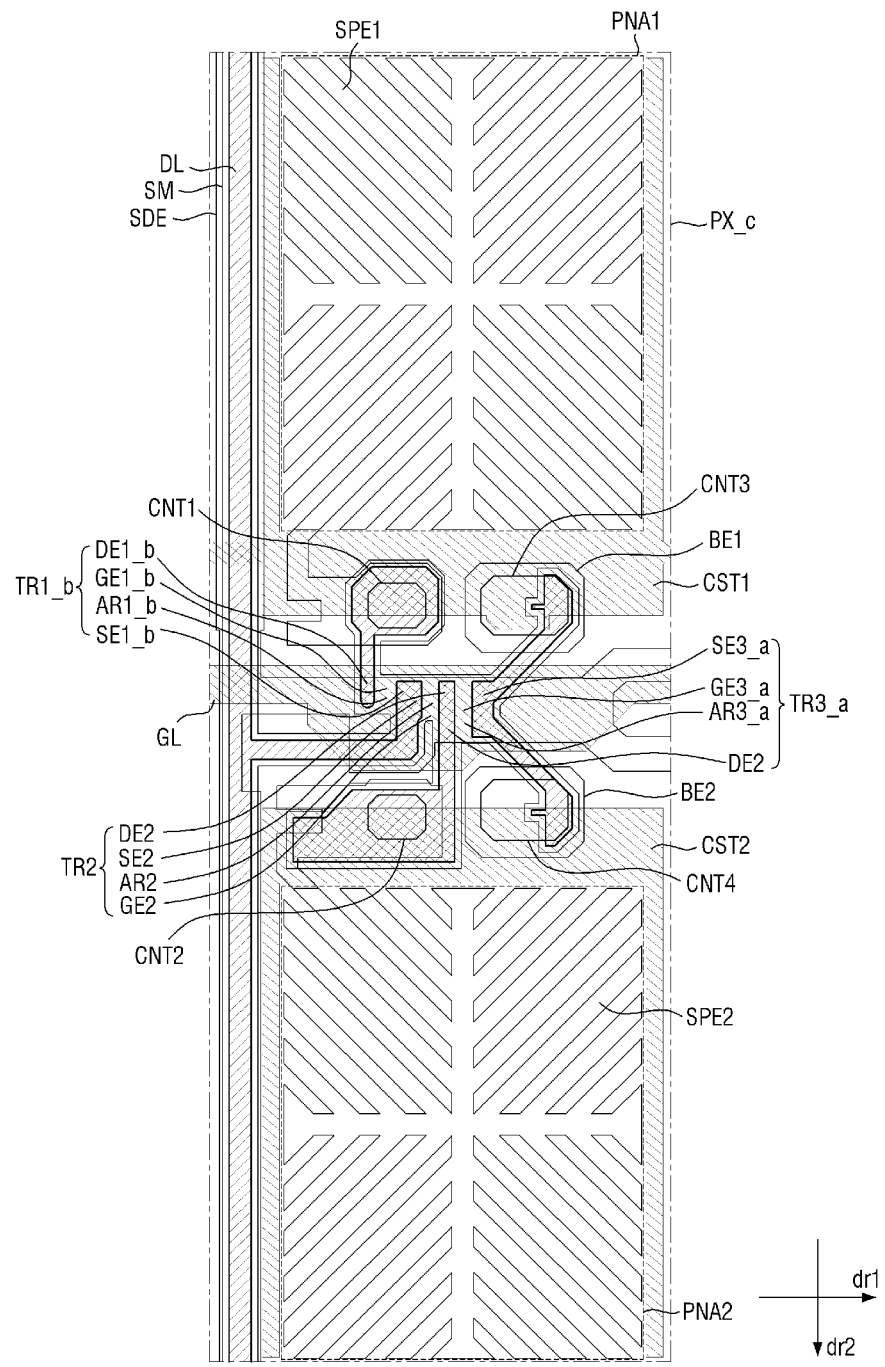
FIG. 10 is a plan view of still another exemplary embodiment of a pixel of an LCD device according to the invention.

FIG. 10 is a plan view of still another exemplary embodiment of a pixel of an LCD device according to the invention.

A pixel PX_c of FIG. 10 includes a third TFT TR3_a, which has the same structure as the third TFT TR3_a of FIG. 8, and a first TFT TR1_b, which has the same structure as the first TFT TR1_b of FIG. 9.

That is, the pixel PX_c has a structure obtained by reflecting both the modifications made by the exemplary embodiments of FIGS. 8 and 9.

Figure 11:
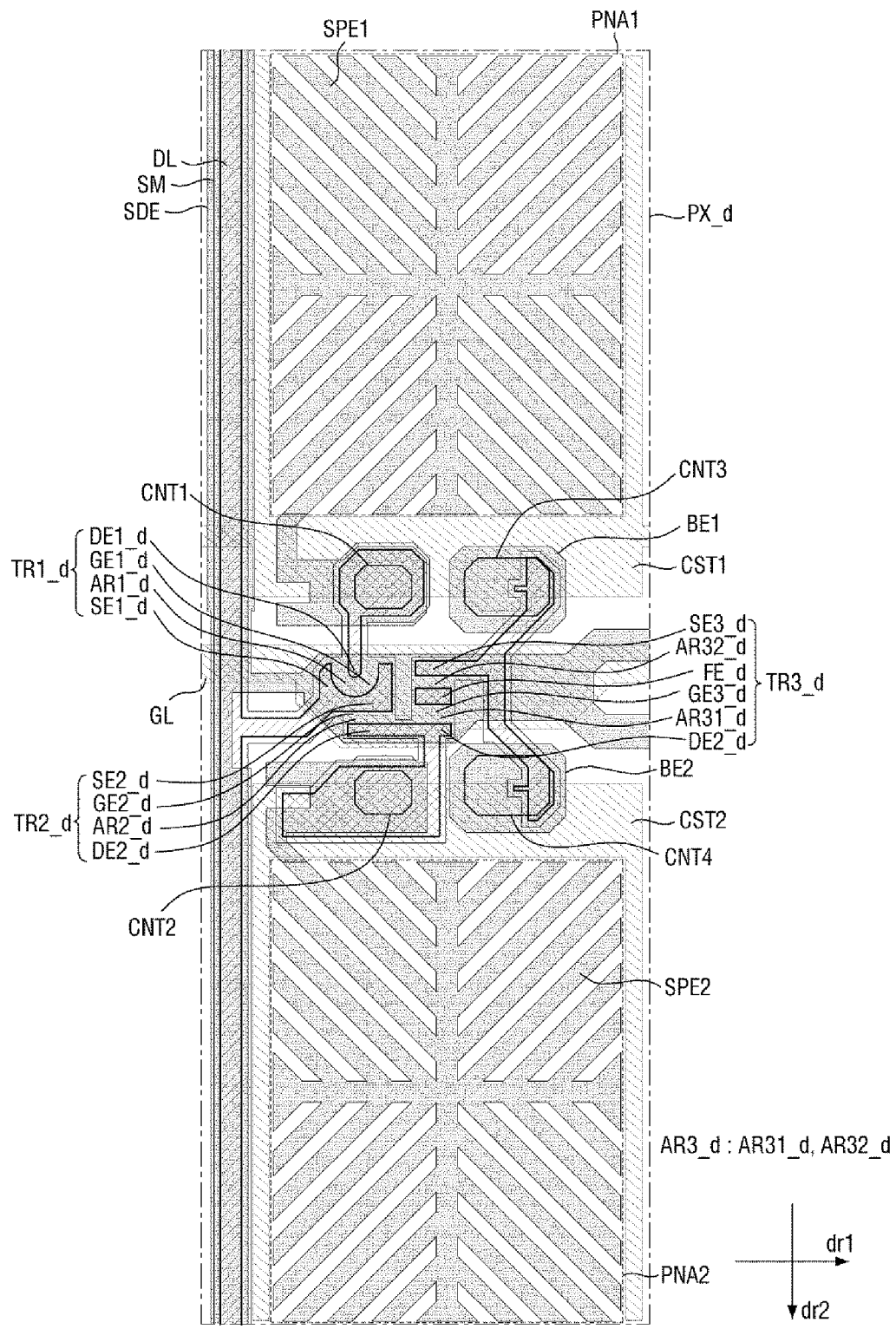
FIG. 11 is a plan view of still another exemplary embodiment of a pixel of an LCD device according to the invention.

FIG. 11 is a plan view of still another exemplary embodiment of a pixel of an LCD device according to the invention.

A pixel PX_d of FIG. 11 differs from the pixel PX of FIG. 1 in that both the length directions of second and third channels are a second direction dr2. The pixel PX_d will hereinafter be described, focusing mainly on differences with the pixel PX of FIG. 1.

Referring to FIG. 11, the pixel PX_d includes a gate line GL, a semiconductor layer SM, a data line DL, a first TFT TR1_d, a second TFT TR2_d, a third TFT TR3_d, a first contact hole CNT1, a second contact hole CNT2, a third contact hole CNT3, a fourth contact hole CNT4, a first sub-pixel electrode SPE1, a second sub-pixel electrode SPE2, a first bridge electrode BE1, a second bridge electrode BE2, and a shielding electrode SDE.

The length direction of the second channel of the second TFT TR2_d may be the second direction dr2. In other words, both the second drain electrode DE2_d and the second source electrode SE2_d, which are adjacent to a second active region AR2_d, may extend in a first direction dr1.

Also, the length direction of the third channel of the third TFT TR3_d may be the second direction dr2. In other words, both the second drain electrode DE2_d and the third source electrode SE3_d, which are adjacent to a third active region AR3_d, may extend in the first direction dr1. Here, the third active region AR3_d includes a first part of the third active region AR31_d and a second part of the third active region AR32_d.

If the lenses of an exposure apparatus apply UV light while moving in the second direction dr2 in the manufacturing process, deviations in the lengths of the second and third channels between the pixel PX_d and other pixels PX_d can be effectively minimized.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A liquid crystal display (LCD) device, comprising:
   a substrate;
   a gate line and a data line intersecting with each other and disposed on the substrate, the gate line extending in a first direction and the data line extending in a second direction;
   first through third thin-film transistors (TFTs) disposed on the substrate; and
   first and second sub-pixel electrodes disposed above the first through third TFTs,
   wherein
   the first TFT includes a first source electrode electrically connected to the data line, a first drain electrode electrically connected to the first sub-pixel electrode, and a first channel between the first source electrode and the first drain electrode,
   the second TFT includes a second source electrode electrically connected to the data line, a second drain electrode electrically connected to the second sub-pixel electrode, and a second channel formed in a first bar-shaped region between the second source electrode and the second drain electrode,
   the third TFT includes a third source electrode electrically connected to a sustain electrode, the second drain electrode, and a third channel formed in a second bar-shaped region between the third source electrode and the second drain electrode, a length direction of the second channel extending in the first direction is same as a length direction of the third channel extending in the first direction, portions of both the second drain electrode and the second source electrode closest to the second channel extend in the second direction, and portions of both the second drain electrode and the third source electrode closest to the third channel extend in the second direction.

2. The LCD device of claim 1, wherein the length direction of the second channel is same as a first direction in which the gate line extends.

3. The LCD device of claim 1, wherein the second drain electrode extends in a second direction perpendicular to the first direction.

4. The LCD device of claim 1, further comprising a floating electrode between the third source electrode and the second drain electrode.

5. The LCD device of claim 4, wherein the third channel includes a first portion between the second drain electrode and the floating electrode, and a second portion between the third source electrode and the floating electrode.

6. The LCD device of claim 1, wherein the first channel has a U-shape.

7. The LCD device of claim 1, wherein the length direction of the second channel is same as a length direction of the first channel.

8. The LCD device of claim 1, further comprising a sustain electrode disposed on a same layer with the gate line.

9. The LCD device of claim 8, wherein the third source electrode is electrically connected to the sustain electrode.

10. The LCD device of claim 8, wherein a difference between a voltage provided to the first sub-pixel electrode and the voltage provided to the sustain electrode is greater than a difference between the voltage provided to the second sub-pixel electrode and the voltage provided to the sustain electrode.

11. A liquid crystal display (LCD) device, comprising:
a substrate;
a gate line and a data line intersecting with each other and disposed on the substrate;
first through third thin-film transistors (TFTs) disposed on the substrate; and
first and second sub-pixel electrodes disposed above the first through third TFTs, wherein
the first TFT includes a first source electrode electrically connected to the data line, a first drain electrode electrically connected to the first sub-pixel electrode, and a first channel between the first source electrode and the first drain electrode, the second TFT includes a second source electrode electrically connected to the data line, a second drain electrode electrically connected to the second sub-pixel electrode, and a second channel directly between a portion of the second source electrode and a portion of the second drain electrode, the third TFT includes a third source electrode electrically connected to a sustain electrode, the second drain electrode, and a third channel directly between a portion of the third source electrode and the portion of the second drain electrode, and the portion of second drain electrode extends in a first direction in which the gate line extends, wherein the first source electrode, the second source electrode and the first drain electrode all extend in a second direction in which the data line extends.

12. The LCD device of claim 11, wherein the second source electrode extends in the first direction.

13. The LCD device of claim 11, wherein the third source electrode extends in the first direction.

14. The LCD device of claim 11, wherein the first channel has a U-shape.

15. The LCD device of claim 11, wherein a length direction of the second channel is same as a length direction of the third channel.

16. The LCD device of claim 11, wherein a length direction of the second channel is same as a length direction of the first channel.

17. The LCD device of claim 16, wherein the length direction of the second channel is same as a second direction in which the data line extends.

18. The LCD device of claim 16, wherein the first source electrode and the first drain electrode extend in the first direction.

19. The LCD device of claim 18, wherein the first source electrode and the second source electrode are defined as single source electrode.

20. The LCD device of claim 19, wherein the single source electrode is between the first drain electrode and the second drain electrode in the second direction.

* * * * *